United States Patent
Adorni et al.

(10) Patent No.: US 7,108,167 B2
(45) Date of Patent: Sep. 19, 2006

(54) WIRE BONDER WITH A DEVICE FOR DETERMINING THE VECTORIAL DISTANCE BETWEEN THE CAPILLARY AND THE IMAGE RECOGNITION SYSTEM AND METHOD

(75) Inventors: Roland Adorni, Cham (CH); Silvan Thuerlemann, Unteraegeri (CH)

(73) Assignee: ESEC Trading SA, Cham (CH)

( * ) Notice: Subject to any disclaimer, the term of this patent is extended or adjusted under 35 U.S.C. 154(b) by 98 days.

(21) Appl. No.: 10/819,652

(22) Filed: Apr. 7, 2004

(65) Prior Publication Data

US 2004/0200884 A1   Oct. 14, 2004

(30) Foreign Application Priority Data

Apr. 14, 2003   (CH) .................................. 0677/03

(51) Int. Cl.
   *B23K 31/02*   (2006.01)
(52) U.S. Cl. ............... 228/180.5; 228/4.5; 228/4.1; 228/1.1; 228/110.1
(58) Field of Classification Search ............. 228/180.5, 228/4.5, 110.1, 103
   See application file for complete search history.

(56) References Cited

U.S. PATENT DOCUMENTS

| 5,114,302 A | | 5/1992 | Meisser et al. |
| 5,199,630 A | * | 4/1993 | Felber et al. ............... 228/102 |
| 5,456,403 A | * | 10/1995 | Nishimaki et al. ........... 228/102 |
| 5,458,280 A | * | 10/1995 | Nishimaki et al. ........... 228/102 |
| 5,474,224 A | * | 12/1995 | Nishimaki et al. ........... 228/102 |
| 5,566,876 A | * | 10/1996 | Nishimaki et al. ........... 228/102 |
| 5,699,951 A | * | 12/1997 | Miyoshi ..................... 228/4.5 |
| 5,702,049 A | | 12/1997 | Biggs et al. |
| 6,371,356 B1 | * | 4/2002 | Senuma .................... 228/110.1 |
| 6,460,751 B1 | | 10/2002 | Thürlemann |
| 6,464,126 B1 | * | 10/2002 | Hayata et al. .............. 228/105 |
| 6,467,673 B1 | * | 10/2002 | Enokido et al. ............ 228/105 |

(Continued)

FOREIGN PATENT DOCUMENTS

JP   01-093135   4/1989

(Continued)

*Primary Examiner*—Jonathan Johnson
*Assistant Examiner*—Rachel E. Beveridge
(74) *Attorney, Agent, or Firm*—McCormick, Paulding & Huber LLP

(57) ABSTRACT

A Wire Bonder comprises a bondhead that can be moved in a horizontal plane that has a capillary clamped to a horn and parts of an image recognition system. The tip of the capillary and the optical axis of the image recognition system are separated by a vectorial distance D. The Wire Bonder has a device with a body with an optical marking and with two stop faces that enable the vectorial distance D to be recalibrated at any time. The control program of the Wire Bonder is set up on the one hand to move the capillary towards the first stop face and to determine a first co-ordinate $x_C$ of the position of the bondhead as soon as the capillary touches the first stop face and then to move the capillary towards the second stop face and to determine a second co-ordinate $y_C$ of the position of the bondhead as soon as the capillary touches the second stop face. The control program is further set up to determine the co-ordinates ($x_A$, $y_A$) of the bondhead at which the optical axis of the image recognition system passes through the optical marking at a predetermined point. And the control program is set up to recalibrate the vectorial distance D under consideration of the acquired co-ordinates $x_A$, $y_A$, $x_C$ and $y_C$.

3 Claims, 2 Drawing Sheets

U.S. PATENT DOCUMENTS

Figure 1:
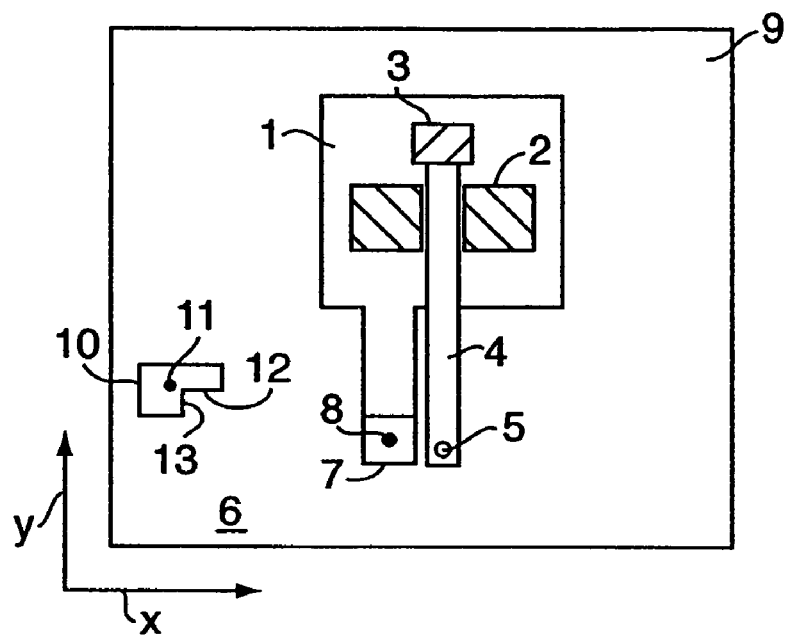

| | | | |
|---|---|---|---|
| 6,516,990 B1 * | 2/2003 | Hess et al. | 228/4.5 |
| 6,669,076 B1 * | 12/2003 | Nogawa | 228/4.5 |
| 6,857,554 B1 * | 2/2005 | Hess et al. | 228/103 |
| 2001/0011669 A1 | 8/2001 | Hayata et al. | |
| 2003/0178469 A1 | 9/2003 | Hess et al. | |

FOREIGN PATENT DOCUMENTS

| | | |
|---|---|---|
| JP | 03-296235 | 12/1991 |
| JP | 63-136535 | 6/1998 |

* cited by examiner

WIRE BONDER WITH A DEVICE FOR DETERMINING THE VECTORIAL DISTANCE BETWEEN THE CAPILLARY AND THE IMAGE RECOGNITION SYSTEM AND METHOD

PRIORITY CLAIM

Applicant hereby claims foreign priority under 35 U.S.C § 119 from Swiss Application No. 2003 0677/03 filed Apr. 14, 2003, the disclosure of which is herein incorporated by reference.

FIELD OF THE INVENTION

A Wire Bonder is a machine with which semiconductor chips are wired after mounting on a substrate. The Wire Bonder has a capillary that is clamped to the tip of a horn. The capillary serves to secure the wire to a connection point on the semiconductor chip and to a connection point on the substrate as well as to guide the wire between the two connection points. On producing the wire connection between the connection point on the semiconductor chip and the connection point on the substrate, the end of the wire protruding out of the capillary is first melted into a ball. Afterwards, the wire ball is secured to the connection point on the semiconductor chip by means of pressure and ultrasonics. In doing so, ultrasound is applied to the horn from an ultrasonic transducer. This process is called ball bonding. The wire is then pulled through to the required length, formed into a wire loop and welded to the connection point on the substrate. This last part of the process is called wedge bonding. After securing the wire to the connection point on the substrate, the wire is torn off and the next bonding cycle can begin. Before bonding, the position of the connection points is determined by means of an image recognition system so that the capillary touches down in the right place on the connection point. In operation, a problem exists in that the vectorial distance D between the capillary and the optical axis of the image recognition system, known in the art as the "camera-capillary-offset", can change in an unpredictable manner because of thermal effects. The vectorial distance D therefore has to be continuously checked and adjusted.

Different solutions are known in order to eliminate or at least to compensate as far as possible the thermal influence on the vectorial distance D between the capillary and the optical axis of the image recognition system.

With a first solution, temperature sensors are mounted on the arm to which the optical elements of the image recognition system are attached that define the position of the optical axis and on the arm to which the horn carrying the capillary is attached. The temperatures recorded with the temperature sensors are used in order to calculate the thermally caused material expansions and to adjust the vectorial distance D according to the calculated expansions. This method often delivers unsatisfactory results because it is not the temperature distribution throughout the whole material that is known but only the temperature at one or two locations, namely where the temperature sensors are mounted. Furthermore, the platform that carries the optical elements (camera, mirror, lens and housing) and the capillary consists of several mechanical parts that can no longer be simply characterised by means of one or several expansion coefficients.

With a second solution, the position of the bonded balls is checked periodically with the camera. Any difference between the set position and the actual position of the ball corresponds to the difference by which the camera-capillary-offset has changed and has to be corrected. Normally, several balls are measured and their differences taken into account time weighted in order to achieve a stable correction. The disadvantage with this solution is that in any case a ball has to be bonded before a first measurement and correction of the camera-capillary-offset can take place. If the Wire Bonder was stopped for a certain time, then the camera-capillary-offset could have changed so dramatically that the first ball no longer lies completely within the pad. The current semiconductor chip is therefore wasted. In addition, measurement of the bonded balls with the camera is not easy. As a result of the process, the shape of the ball is subject to deviations and there is always the danger that individual ball positions are measured wrongly.

An optical measuring system for measuring the vectorial distance between the capillary and the optical axis of a camera is known from US 20010011669. This measuring system requires a relatively large amount of space.

The object of the invention is to develop a measuring system with which the vectorial distance between the capillary and the optical axis of the image recognition system can be determined in a simple and reliable manner.

SUMMARY OF THE INVENTION

A Wire Bonder comprises a bondhead movable in a horizontal plane that has a capillary clamped to a horn and optical components of an image recognition system. The tip of the capillary and the optical axis of the image recognition system are separated by a vectorial distance D. In accordance with the invention, the Wire Bonder has a device with a body with an optical marking and with two stop faces that enable the vectorial distance D to be recalibrated at any time. The control program of the Wire Bonder is set up on the one hand to move the capillary towards the first stop face and to determine a first co-ordinate $x_C$ of the position of the bondhead as soon as the capillary touches the first stop face and then to move the capillary towards the second stop face and to determine a second co-ordinate $Y_C$ of the position of the bondhead as soon as the capillary touches the second stop face. The control program is additionally set up to determine the co-ordinates $(x_A, y_A)$ of the bondhead with which the optical axis of the image recognition system passes through the optical marking at a predetermined point. And, the control program is set up to recalibrate the vectorial distance D in consideration of the measured co-ordinates $x_A$, $y_A$, $x_C$ and $y_C$.

In production, in order that the capillary can be lowered at the right place on the respective connection point, those co-ordinates $(x_1, y_1)$ are always determined by means of the image recognition system that the bondhead has to occupy in order that the optical axis of the image recognition system passes through the desired touchdown point of the capillary on the connection point. The co-ordinates $(x_2, y_2)$, that have to be occupied by the bondhead in order that the tip of the capillary impacts on the desired touchdown point result from these co-ordinates $(x_1, y_1)$ by means of adding a vector $D=(d_x, d_y)$, whereby the vector D designates the vectorial distance from the tip of the capillary to the optical axis of the image recognition system: $(x_2, y_2)=(x_1, y_1)+(d_x, d_y)$. The co-ordinates x and y relate to the values delivered by the measuring system for the position of the bondhead.

In order that the vector D can be updated at any time, the following steps are carried out after changing the capillary:

1. Determining the vectorial distance D in a customary way, for example by means of measuring an imprint produced by the capillary on the substrate or semiconductor chip,
2. Definition of a vector $D_0$ as $D_0=D$,
3. Determining those co-ordinates $(x_A, y_A)$ of the bondhead that the bondhead has to occupy in order that the optical axis of the image recognition system passes through a predetermined point on an optical marking provided on a rigidly arranged body,
4. Determining those co-ordinates ($x_C$, $y_C$) of the bondhead that the bondhead has to occupy in order that the capillary touches two stop faces of the body, and
5. Calculation of a reference vector R as $R=(r_X, r_Y)=(x_C, y_C)-(x_A, y_A)$, In production operation of the Wire Bonder, the vectorial distance D can be updated by means of the following steps:
1. Determining those co-ordinates ($x_A$, $y_A$) of the bondhead that the bondhead has to occupy in order that the optical axis of the image recognition system passes through the predetermined point of the optical marking,
2. Determining those co-ordinates ($x_C$, $y_C$) of the bondhead 1, that the bondhead has to occupy in order that the capillary touches the two stop faces of the body,
3. Calculation of a vector K as $K=(k_X, k_Y)=(x_C, y_C)-(x_A, y_A)$, and
4. Updating the vectorial distance D under consideration of the vector $D_0$ and the difference between the vectors K and R.

BRIEF DESCRIPTION OF THE DRAWING FIGURES

The accompanying drawings, which are incorporated into and constitute a part of this specification, illustrate an embodiment of the present invention and, together with the detailed description, serve to explain the principles and implementations of the invention. The Figures are not drawn to scale.

Figure 2:
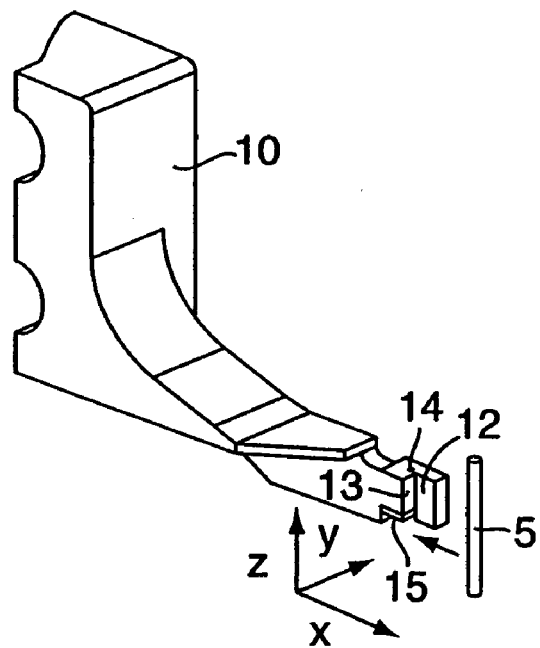
Figure 3:
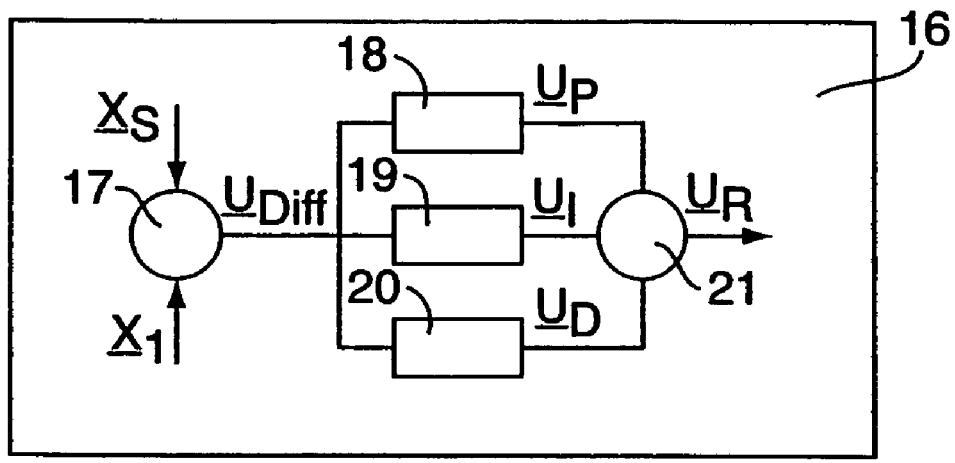
Figure 4:
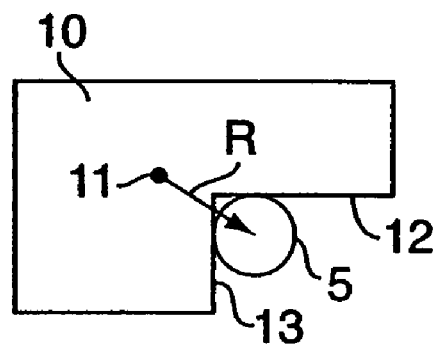

FIG. 1 shows a plan view of a bondhead of a Wire Bonder with a capillary, an image recognition system and a device for determining the vectorial distance between the capillary and the optical axis of the image recognition system, FIG. 2 shows a perspective view of a body with two stop faces, FIG. 3 shows a block diagram of a PID controller, and FIG. 4 shows a plan view of the body with the two stop faces, the capillary and a reference vector.

DETAILED DESCRIPTION OF THE PREFERRED EMBODIMENT

FIG. 1 shows schematically a plan view of a bondhead 1 of a Wire Bonder. The bondhead 1 comprises a rocker 2 that can be rotated on a horizontal axis. A horn 4 to which ultrasound can be applied from an ultrasonic transducer 3 is attached to the rocker 2. A capillary 5 is clamped to the tip of the horn 4. The capillary 5 serves to attach a wire to a connection point of a semiconductor chip and to an assigned connection point of a substrate as well as to guide the wire between the two connection points. The bondhead 1 enables movement of the capillary 5 in a plane 6 formed between the two co-ordinate axes x and y while the rocker 2 enables movement vertical to the plane 6. In addition, the Wire Bonder has an image recognition system the field of view of which is aligned to the plane 6 and that serves to measure the position of the connection points on the semiconductor chip and the substrate. The image recognition system comprises a camera 7 and an image analysis system. The image recognition system has an optical axis 8 that runs vertically to the plane 6. In the example presented, the camera 7 is attached to the bondhead 1 and its field of view is aligned directly to the plane 6. In the example, the optical axis 8 of the image recognition system coincides with the optical axis of the camera 7. It can however be necessary or desired to use additional optical components such as lenses, mirrors, prisms, etc, in order to guide the beam path and/or to be able to change the size of the field of view of the image recognition system.

The bondhead 1 glides for example on a vacuum pre-charged air bearing on a slide plate 9. A bondhead 1 of this type is known from U.S. Pat. No. 5,114,302 that can be moved in x or y direction by means of two electro-magnetic drives. A further bondhead 1 of this type is known from U.S. Pat. No. 6,460,751 that has a linear and a rotational drive in order to move the capillary 5 in the plane 6. It is however also known to move the bondhead 1 by means of an xy table. The position of the bondhead 1 in the plane 6, ie, the xy co-ordinates of the bondhead 1, is acquired in a known manner by means of a measuring system, for example an optical measuring system.

A first and a second motor are present for movement of the bondhead 1 in the plane 6 whereby the first motor is controlled by a first controller and the second motor by a second controller. In the example, the measuring system consists of glass or metal graduated scales and assigned reading heads arranged on the bondhead 1.

The invention is explained on the example of Cartesian co-ordinates xy. In production, in order that the capillary 5 can be lowered at the right place on the respective connection point, those co-ordinates ($x_1$, $y_1$) are always determined by means of the image recognition system that the bondhead 1 has to occupy so that the optical axis 8 of the image recognition system passes through the desired touchdown point of the capillary 5 on the connection point. The co-ordinates ($x_2$, $y_2$), that the bondhead 1 has to occupy so that the tip of the capillary 5 impacts on the desired touchdown point result from these co-ordinates ($x_1$, $y_1$) by means of the addition of a vector $D=(d_X, d_Y)$, whereby the vector D designates the vectorial distance from the tip of the capillary 5 to the optical axis 8 of the image recognition system:

$(x_2, y_2)=(x_1, y_1)+(d_X, d_Y)$. (The co-ordinates x and y relate to the values delivered by the measuring system for the position of the bondhead 1.)

During production, the vectorial distance D can vary in an unpredictable way. It is therefore necessary to repeatedly recalibrate the vectorial distance D. Because the capillary 5 is located outside the field of view of the image recognition system, the position of the tip of the capillary 5 can not be directly determined with the image recognition system. In accordance with the invention, a device is therefore foreseen for the checking and recalibration of the vector $D=(d_X, d_Y)$ that has a body 10 with an optical marking 11 and with two stop faces 12 and 13 by means of which co-ordinates ($x_A$, $y_A$) of the optical axis 8 of the image recognition system as well as co-ordinates ($x_C$, $y_C$) of the tip of the capillary 5 can be determined. The optical marking 11 is for example a circular area or a cross.

FIG. 2 shows a perspective plan view of such a body 10. The alignment of the body 10 in relation to the xyz system of co-ordinates can also be seen in FIG. 2. The first stop face 12 is aligned parallel to the x direction, the second stop face 13 is aligned parallel to the y direction. In the immediate vicinity of the two stop faces 12, 13 there is a drill hole 14 running in z direction the lower end of which is closed by a glass plate 15 with the optical marking 11 (not visible in the Figure). The body 10 is positioned in relation to the z height so that the optical marking 11 is located in the depth of focus of the camera 7. When the drill hole 14 is located in the field of view of the image recognition system, then, in the picture delivered by the camera 7 (FIG. 1), the optical marking 11 is recognisable with sufficient sharpness. The two stop faces 12, 13 are preferably positioned in z direction so far above the optical marking 11 that the capillary 5 always touches the stop faces 12, 13 in the upper area of its shaft, as far as possible immediately below the clamping position on the horn 4.

The capillary 5 consists of a longitudinal, round shaft narrowed towards the tip with a longitudinal drill hole through which the wire is guided. Because the diameter of the shaft can vary from capillary to capillary by several micrometers, a vector $D_0=(d_X, d_Y)$ on the one hand and a reference vector $R=(r_X, r_Y)$ on the other hand have to be determined after each capillary change.

Determining the vector $D_0$ takes place in a generally known way in accordance with the following steps:
1. An imprint of the capillary is produced on the substrate (or on the semiconductor chip) and the co-ordinates $(x_p, y_p)$ of the position of the bondhead 1 are determined at which the imprint was produced.
2. The bondhead 1 is moved until the imprint of the capillary 5 is located in the field of view of the image recognition system. Then the co-ordinates $(x_v, y_v)$ of the position of the bondhead 1 are determined that the bondhead 1 has to occupy so that the optical axis 8 of the image recognition system passes through the imprint.
3. The vector $D_0$ is defined as $D_0=(d_{X0}, d_{Y0})=(x_p, y_p)-(x_v, y_v)$, ie, $d_{X0}=x_p-x_v$ and $d_{Y0}=y_p-y_v$.

Determining the reference vector $R=(r_X, r_Y)$ takes place in accordance with the following steps:
1. The bondhead 1 is moved until the optical marking 11 is located in the field of view of the image recognition system. The optical marking 11 appears in the picture delivered by the camera 7. From the picture delivered by the camera 7, those co-ordinates $(x_A, y_A)$ of the bondhead 1 are now determined that the bondhead 1 has to occupy so that the optical axis 8 of the image recognition system passes through a predetermined point of the optical marking 11, preferably its centre.
2. The bondhead 1 is moved at a predetermined speed in a first predetermined direction, in the example in the x direction, towards the first stop face 12 of the body 10 whereby the first controller controls the movement of the bondhead 1. The measuring system continually delivers the current actual value of the x co-ordinate of the position of the bondhead 1. The point in time $t_1$, at which the capillary 5 impacts on the first stop face 12 is determined based on a signal formed in the first controller. Then the value $x_C$ of the x co-ordinate of the position of the bondhead 1 is determined at which the bondhead 1 was located at point in time $t_1$.
3. The bondhead 1 is moved at a predetermined speed in a second predetermined direction, in the example in the y direction, towards the second stop face 13 of the body 10 whereby now the second controller controls the movement of the bondhead 1. The measuring system continually delivers the current actual value of the y co-ordinate of the position of the bondhead 1. The point in time $t_2$, at which the capillary 5 impacts on the second stop face 13 is determined based on a signal formed in the second controller. Then the value $y_C$ of the y co-ordinate of the position of the bondhead 1 is determined at which the bondhead 1 was located at point in time $t_2$.
4. The reference vector R is now calculated as:

$$R=(r_X, r_Y)=(x_C, y_C)-(x_A, y_A), \text{ ie, } r_X=x_C-x_A \text{ and } r_Y=y_C-y_A.$$

The execution of step 2 will now be explained in more detail. FIG. 3 shows schematically the first controller 16 designed as a PID controller. The controller 16 has an input section 17 to which on the one hand the current actual value $x_I$ of the x co-ordinate of the bondhead 1 and to which on the other hand the current set value $x_S$ of the x co-ordinate of the bondhead 1 are supplied. The input section 17 forms the differential signal $U_{Diff}=x_I-x_S$ and leads this to a proportional amplifier 18, an integrator 19 and a differentiator 20 that are connected in parallel. An output section 21 sums up the output signals $U_P$ of the proportional amplifier 18, $U_I$ of the integrator 19 and $U_D$ of the differentiator 20 to one output signal $U_R$ of the controller 16 that controls the x drive of the bondhead 1. The difference $x_I-x_S$ or the output signal $U_I$ of the integrator 19 is particularly suitable for detection of the point in time $t_1$ at which the capillary 5 impacts on the first stop face 12. The differential signal $U_{Diff}$ is designated as the system deviation. When the capillary 5 moves towards the first stop face at constant speed, then the system deviation disappears. However, as soon as the capillary 5 meets with the first stop face 12 and touches it, then the system deviation $U_{Diff}$ increases. The output signal $U_I$ of the integrator 19 also increases. These two signals in particular, ie, the system deviation $U_{Diff}$ and the output signal $U_I$ of the integrator 19, are suitable for detection of the point in time $t_1$, at which the capillary 5 impacts on the first stop face 12. Step 3 is carried out analogously.

For a precise acquisition of the point in time $t_1$ (or $t_2$) it is of advantage to follow the course of the system deviation $U_{Diff}$ or the output signal $U_I$ and to acquire the point in time $t_1$ (or $t_2$) from the course of the signal under consideration of customary mathematical and statistical methods.

The control program is preferably set up to stop the movement of the bondhead 1 and to move the bondhead 1 away in the opposite direction as soon as the system deviation $U_{Diff}$ or the output signal $U_I$ exceeds a predetermined value.

If the system deviation $U_{Diff}$ is used to acquire the point in time $t_1$ (or $t_2$), it is advantageous to keep the amplification factor of the integrator 19 comparatively low.

The body 10 consists of a material of great hardness so that, on impacting on the stop faces 12 and 13, the capillary 5 meets with a great mechanical resistance that causes a considerable change in the system deviation $U_{Diff}$.

FIG. 4 shows a plan view of the two stop faces 12 and 13 of the body 10, the capillary 5 and the reference factor R acquired in accordance with the previously described method. The capillary 5 touches the two stop faces 12 and 13. The reference vector R points from the optical marking 11 towards a point within the capillary 5 that lies on the symmetrical axis of the circular shaft of the capillary 5.

Operation of the Wire Bonder can now be started whereby the control program of the Wire Bonder takes into consideration the camera-capillary-offset by means of the vector $D_0$ that corresponds to the vectorial distance immediately after capillary change. Any change to the vectorial distance through temperature changes or other causes, can be measured with great accuracy and taken into consideration at any time during operation of the Wire Bonder by means of a recalibration. The recalibration takes place in accordance with the following steps:
1. A vector K is determined in the same way as for the reference vector R. The vector K is therefore acquired as $$K=(k_X, k_Y)=(x_C, y_C)-(x_A, y_A), \text{ ie, } k_x=x_C-x_A \text{ and } k_Y=y_C-y_A,$$

whereby the co-ordinates $x_C$, $y_C$, $x_A$ and $y_A$ are determined in accordance with the steps 1 to 3 used for determining the reference vector R.
2. The vector D is updated by the difference in the vectors R and K to $D=D_0+K-R$. The updated vector D now corresponds to the updated current vectorial distance from the capillary 5 to the optical axis 8 of the image recognition system.

The body 10 must be secured to the Wire Bonder so that it can not rotate, as a rotation of the body 10 would lead to an error in the recalibration. Furthermore, the body 10 must comprise a material the thermal expansion coefficient of which is as low as possible. Such a material is for example invar. In order to keep any errors as low as possible, the optical marking 11 is preferably arranged as close as possible to the stop faces 12, 13.

The invention can also be used on a Wire Bonder with a rotational bondhead as is described in U.S. Pat. No. 6,460,751. With such a Wire Bonder the position of the bondhead 1 is defined by means of a linear co-ordinate and an angular co-ordinate. The vectors $D_0$, R and K are then defined by means of co-ordinates of the form (x=linear co-ordinate, y=angular co-ordinate). A first motor moves the bondhead 1 in a predetermined horizontal direction and a second motor turns the horn 4 with the capillary 5 attached to the bondhead 1 on a vertical axis that moves with the bondhead 1. A first controller controls the first motor and a second controller controls the second motor. When the first motor moves the bondhead 1 at a predetermined speed and therefore the capillary 5 towards the first stop face 12, then the controller for the second motor holds the horn 4 in a predetermined angular position. As soon as the capillary 5 touches the first stop face 12, the angular co-ordinate of the horn 4 also changes. As a result, a signal of the second controller (eg, the system deviation $U_{Diff}$ or the output signal $U_I$ of the integrator 19) can also be used in order to detect the point in time at which the capillary 5 touches the first stop face 12.

It is also possible to foresee a third and fourth stop face and to use the third and fourth stop faces to determine a second reference vector $R_2$. In production, the vector K is then determined by means of the first and second stop faces and a second vector $K_2$ by means of the third and fourth stops faces. The differential vector $K_2-K$ of the two vectors $K_2$ and K must always be equal to the difference $R_2-R$ of the two reference vectors R and $R_2$. If this is not the case, then this indicates an error in the measurement or another error.

Furthermore, it is possible to arrange the optical marking 11 so far away from the two stop faces 12 and 13 that the optical marking 11 is located at the position of the capillary 5 as shown in FIG. 4 in the field of view of the camera 7. The advantage is that the travel ways of the bondhead 1 for determining the vector R or K are very short. The disadvantage is that a linear deformation of the body 10 results in a larger error than when the optical marking 11 is arranged as close as possible to the stop faces 12 and 13.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A wire bonder, comprising
   an image recognition system,
   a bondhead movable in a horizontal plane and comprising
      a horn and a capillary clamped to the horn and at least one component of the image recognition system,
   a measuring system for acquiring a position of the bondhead,
   a control program for control of the position of the bondhead, and
   a device for determining and updating a vectorial distance between a tip of the capillary and an optical axis of the image recognition system, the device comprising a body with an optical marking and with two stop faces, the first stop face being aligned parallel to a first axis defining the horizontal plane and the second stop face being aligned parallel to a second axis defining the horizontal plane, wherein the control program is set up to move the capillary towards the first stop face and to determine a first co-ordinate of the position of the bondhead as soon as the capillary touches the first stop face and to move the capillary towards the second stop face and to determine a second co-ordinate of the position of the bondhead as soon as the capillary touches the second stop face and wherein the control program is set up to determine the co-ordinates of the bondhead at which the optical axis of the image recognition system passes through a predetermined point of the optical marking.

2. A method for updating a vectorial distance D between a tip of a capillary and an optical axis of an image recognition system of a wire bonder, the wire bonder comprising a bondhead movable in a plane and carrying the capillary and at least one component of the image recognition system, wherein a position of the bondhead in the plane is defined with co-ordinates (x, y) wherein after a change of the capillary the following steps are carried out:
   determining the vectorial distance D,
   defining a vector $D_0=D$,
   determining those co-ordinates $(x_A, y_A)$ of the bondhead that the bondhead must occupy so that the optical axis of the image recognition system passes through a predetermined point of an optical marking arranged on a body arranged rigidly on the wire bonder,
   determining those co-ordinates $(x_C, y_C)$ of the bondhead that the bondhead must occupy so that the capillary touches two stop faces of the body, the first stop face being aligned parallel to a first axis defining the plane and the second stop face being aligned parallel to a second axis defining the plane, and
   calculating a reference vector R as $R=(r_X, r_Y)=(x_C, y_C)-(x_A, y_A)$,
and wherein to update the vectorial distance D the following steps are carried out:
   determining those co-ordinates $(x_A, y_A)$ of the bondhead, that the bondhead must occupy so that the optical axis of the image recognition system passes through the predetermined point of the optical marking,
   determining those co-ordinates $(x_C, y_C)$ of the bondhead, that the bondhead must occupy so that the capillary touches the two stop faces of the body,
   calculating a vector K as $K=(k_X, k_Y)=(x_C, y_C)-(x_A, y_A)$, and
   using the vector $D_0$ and a difference in the vectors K and R for updating the vectorial distance D.

3. The method according to claim 2, wherein in the last step of claim 2 the vector D is updated as $$D=D_0+K-R.$$

* * * * *